US009585250B2

(12) United States Patent
Sato et al.

(10) Patent No.: US 9,585,250 B2
(45) Date of Patent: Feb. 28, 2017

(54) CONDUCTIVE PASTE AND CERAMIC SUBSTRATE MANUFACTURED USING THE SAME

(71) Applicants: TDK Corporation, Tokyo (JP); Tanaka Kikinzoku Kogyo K.K., Tokyo (JP)

(72) Inventors: Minoru Sato, Tokyo (JP); Tomoaki Kawata, Tokyo (JP); Masahiro Hirano, Hiratsuka (JP); Shigekazu Onozumi, Hiratsuka (JP)

(73) Assignees: TDK Corporation, Tokyo (JP); Tanaka Kikinzoku Kogyo K.K., Tokyo (JP)

( * ) Notice: Subject to any disclaimer, the term of this patent is extended or adjusted under 35 U.S.C. 154(b) by 196 days.

(21) Appl. No.: 14/433,153

(22) PCT Filed: Oct. 2, 2013

(86) PCT No.: PCT/JP2013/076778
§ 371 (c)(1),
(2) Date: Apr. 2, 2015

(87) PCT Pub. No.: WO2014/054671
PCT Pub. Date: Apr. 10, 2014

(65) Prior Publication Data
US 2015/0282309 A1  Oct. 1, 2015

(30) Foreign Application Priority Data

Oct. 3, 2012 (JP) ................................. 2012-220926

(51) Int. Cl.
*H01B 1/00* (2006.01)
*H01B 1/12* (2006.01)
(Continued)

(52) U.S. Cl.
CPC .............. *H05K 1/092* (2013.01); *B32B 18/00* (2013.01); *C04B 35/10* (2013.01); *C09D 5/24* (2013.01);
(Continued)

(58) Field of Classification Search
CPC ....................................................... H01B 1/02
(Continued)

(56) References Cited

U.S. PATENT DOCUMENTS

2007/0187652 A1* 8/2007 Konno ..................... H01B 1/02
252/500

FOREIGN PATENT DOCUMENTS

JP          1-232797 A      9/1989
JP          4-329207 A     11/1992
(Continued)

OTHER PUBLICATIONS

International Search Report issued in corresponding PCT/JP2013/076778 application (pp. 1-2).
(Continued)

*Primary Examiner* — Khanh Tuan Nguyen
(74) *Attorney, Agent, or Firm* — Millen White Zelano & Branigan, P.C.

(57) ABSTRACT

[Problem to be solved] The present invention provides a conductive paste for constrained firing and a ceramic substrate manufactured with the conductive paste, the conductive paste having an excellent plating resistance and a good adherence against a ceramic substrate and a plated film even after plating treatment, wherein a constraining layer after firing can be easily removed without remaining on a surface conductor in a case where co-firing is performed.
[Solution] Provided is a conductive paste comprising 60 to 95 mass % of an Ag powder as the content in a paste composition, 0.5 to 5 mass % of a borosilicate based glass
(Continued)

powder relative to the Ag powder, the remainder being a platinum group metal additive and an organic vehicle, wherein the platinum group metal additive contains at least two metals of Ru and Rh, and the content of Ru and the content of Rh in the platinum group metal additive are 0.05 to 5 mass % of Ru and 0.001 to 0.1 mass % of Rh respectively in terms of metal components relative to the mass of the Ag powder 5 Claims, 2 Drawing Sheets (51) Int. Cl.
    *H05K 1/09*     (2006.01)
    *H01B 1/22*     (2006.01)
    *H05K 3/24*     (2006.01)
    *C04B 35/10*     (2006.01)
    *C09D 5/24*     (2006.01)
    *H01B 1/16*     (2006.01)
    *B32B 18/00*     (2006.01)
    *H05K 3/46*     (2006.01)

(52) U.S. Cl.
    CPC ............... *H01B 1/16* (2013.01); *H01B 1/22* (2013.01); *H05K 3/246* (2013.01); *C04B 2235/5409* (2013.01); *C04B 2235/5436* (2013.01); *C04B 2235/5445* (2013.01); *C04B 2235/6025* (2013.01); *C04B 2235/6562* (2013.01); *C04B 2235/6567* (2013.01); *C04B 2237/341* (2013.01); *C04B 2237/343* (2013.01); *C04B 2237/562* (2013.01); *C04B 2237/68* (2013.01); *H05K 3/4629* (2013.01); *Y10T 428/24909* (2015.01)

(58) Field of Classification Search
    USPC .......................................................... 252/500
    See application file for complete search history.

(56) References Cited

FOREIGN PATENT DOCUMENTS

| | | |
|---|---|---|
| JP | 2002-141625 A | 5/2002 |
| JP | 2002-290037 A | 10/2002 |
| JP | 2005-268132 A | 9/2005 |

OTHER PUBLICATIONS

English Translation Abstract of JPH 01-232797 A published Sep. 18, 1989.
English Translation Abstract of JPH 04-329207 A published Nov. 18, 1992.
English Translation Abstract of JP 2002-141625 A published May 17, 2002.
English Translation Abstract of JP 2002-290037 A published Oct. 4, 2002.
English Translation Abstract of JP 2005-268132 A published Sep. 29, 2005.

* cited by examiner

CONDUCTIVE PASTE AND CERAMIC SUBSTRATE MANUFACTURED USING THE SAME

FIELD OF INVENTION

The present invention relates to a conductive paste and a ceramic substrate manufactured using the conductive paste, and more specifically relates to an Ag based conductive paste suitable for forming a surface conductor of a low-temperature fired ceramic substrate (an LTCC substrate) to be produced by the constrained firing method, and a ceramic substrate manufactured using the Ag based conductive paste.

BACKGROUND ART

As a firing method used for manufacture of a low-temperature fired ceramic substrate, the constrained firing method (the non-contracting firing method) is known. The constrained firing method has been significantly more often used in recent years as the method is characterized in that the contraction of a substrate in the plane direction (the XY direction) can be reduced to increase dimensional accuracy and flatness. In general, the constrained firing method is known as a method of manufacturing a low-temperature fired ceramic substrate, the method comprising layering an alumina green sheet for constrained firing which is not sintered at 800 to 1000° C. as a constraining layer on at least one surface of a low-temperature fired ceramic green sheet layered product before firing, performing firing at 800 to 1000° C., and then removing the constraining layer. It may be a pressure method comprising pressurizing a ceramic substrate in the thickness direction (the Z direction) when firing, or may be a non-pressure method comprising firing without pressurization. In the pressure method, a low-temperature fired ceramic substrate having higher dimensional accuracy and flatness can be manufactured since a uniform pressure is applied to a ceramic substrate during firing.

On the outermost layer of a low-temperature fired ceramic substrate, a surface conductor such as a surface wiring pattern and a conductor for a wire bonding pad is typically formed with a conductive paste. As the conductive pastes, Ag based conductive pastes such as Ag, Ag—Pd and Ag—Pt, Cu based conductive pastes and Au based conductive pastes are commonly used which are low-melting point noble metals having a low value of electrical resistance and having excellent electrical properties.

Methods of forming a surface conductor with a conductive paste include a co-firing method comprising integrally and simultaneously firing with a low-temperature fired ceramic green sheet layered product, and a post-attachment firing method comprising printing and firing after firing a low-temperature fired ceramic green sheet layered product. The co-firing method, which has fewer steps than the post-attachment firing method due to the lack of the post-attachment step, is superior in terms of better working efficiency, lower production cost and the like. Therefore, recently, the co-firing method has been becoming the mainstream.

In a case where a surface conductor is formed by co-firing using the constrained firing method, residual materials of a constraining layer present on the surface conductor after firing are removed by grinding using a technology such as sandblasting.

Then, in order to obtain reliable electric connection by improving solderability, bonding properties, thermal resistance and the like, a plated film such as Ni, Sn and solder is formed on the surface of a surface conductor by performing plating treatment.

A large number of conductive pastes for forming a surface conductor on a ceramic substrate to be constrained-fired have been reported to date. For example, reported is a conductor powder mainly containing an Ag powder or an Ag based alloy powder, wherein 0.005 to 0.050 wt % of Rh relative to 100 wt % of the conductor powder, and the Ag based powder has a mean particle diameter of primary particles of 1.5 to 4.5 μm as measured by the electron microscopy method and a mean particle diameter of aggregated particles of 5.0 to 12 μm as measured by the centrifugal sedimentation method, and wherein the contraction behavior of a printed conductor when firing is such that the contraction percentage is 2.0 to 10.5% until the temperature increases from 400° C. to 700° C., and the contraction percentage is 10.0 to 21.1% until the temperature increases from 400° C. to 900° C. (see Patent Literature 1). The above conductive paste can reduce the warpage of a fired substrate by allowing the contraction behavior of an Ag based conductive paste to be close to that of a low-temperature fired ceramic green sheet without increasing the loading amounts of glass frit and metal oxides, and can maintain a preferred value of electric resistance of a printed conductor to improve the quality and yield.

Further, reported is a conductive paste for improving the adherence between a substrate and a surface conductor, mainly comprising an Ag powder having a median diameter of from 2.0 μm to 7.0 μm; an inorganic binder mainly comprising glass frit having a softening point of from 650° C. to 800° C.; and an organic vehicle, wherein the glass frit is a $SiO_2$—$B_2O_3$—$R_2O$ based glass wherein R comprises at least one of Li, Na and K, and the $SiO_2$ is contained in the glass frit in an amount of 70% or more by weight ratio, and the loading amount of the glass frit is from 1.5% to 5.0% by weight ratio relative to the Ag powder, and the ratio of the median diameter of the glass frit to that of the Ag powder is 0.4 or less (see Patent Literature 2)

Further, reported is a conductive paste for controlling the deformation and warpage of a ceramic substrate, wherein a post-degreasing contraction occurs in a period from degreasing during firing to the end of firing, and at least one contraction controlling material selected from Pt, Rh, Cu, Pd, Ni and Au is contained, provided that 1 wt % or less in a case where the contraction controlling material is Rh, 5 wt % or less in a case where the contraction controlling material is Pt, and 5 wt % or less in a case where the contraction controlling material is Cu (see Patent Literature 3).

In addition, a conductive paste for sufficiently assuring the adhesive strength of a fired surface conductor against a ceramics substrate and for reducing the occurrence of poor plating is reported, the conductive paste comprising Ag as a main component, a noble metal solid-dissolvable in Ag and a glass component (see Patent Literature 4).

CITATION LIST

Patent Literature

Patent Literature 1: Japanese Patent Application Laid-Open No. 2004-47856
Patent Literature 2: Japanese Patent Application Laid-Open No. 2011-142307
Patent Literature 3: Japanese Patent Application Laid-Open No. 2002-26528

Patent Literature 4: Japanese Patent Application Laid-Open No. 2008-112786

SUMMARY OF INVENTION

Technical Problem

The constrained firing method as described above enables an efficient production of a flat low-temperature fired ceramic substrate with high dimensional accuracy. However, the conventional conductive pastes used therein have the following problems.

To begin with, a first problem is that the conventional conductive pastes used in the constrained firing method has low plating resistance. To the conventional conductive pastes, typically added is glass frit in order to increase the adhesive strength between a surface conductor and a ceramic substrate. Disadvantageously, however, a surface conductor formed with a conductive paste in which glass frit is added, in particular with a conductive paste containing glass frit in which Ag is used as an electrically conductive material may often result in a poorly densified structure. More specifically, since a surface conductor formed with the conventional conductive paste is not sufficiently densified, a plating solution may enter thereinto when electrolytic plating is performed after firing, resulting in decreased adherence of the surface conductor with a ceramic substrate and a plated film and compromised electric conductivity of the surface conductor.

A second problem is that residual materials of a constraining layer are not easily removed from a surface conductor formed with the conventional conductive paste in a case where the surface conductor is co-fired with a ceramic substrate. When exfoliating a constraining layer after co-firing by the constrained firing method, a portion of the constraining layer remains on a surface conductor. When tying to remove the residual materials by polishing, the surface of the surface conductor may also be polished, resulting in generation of unevenness on the surface of the surface conductor. As a result, the adherence between the surface conductor and a plated film may be compromised, resulting in decreased plating adhesion and poor wire bonding.

In view of the above problems, an object of the present invention is to provide a conductive paste for constrained firing and a ceramic substrate manufactured with the conductive paste, the conductive paste having an excellent plating resistance and a good adherence against a ceramic substrate and a plated film even after plating treatment, wherein a constraining layer after firing can be easily removed without remaining on a surface conductor in a case where co-firing is performed.

Solution to Problem

After conducting extensive studies to achieve the above object, the present inventors find that the above problems can be solved by optimizing the types and contents of an Ag powder, a glass powder and a platinum group metal additive among various components of a conductive paste, and preferably, further optimizing the type of the Ag powder. Then the present invention is completed.

More specifically, the conductive paste according to the present invention is a conductive paste to be printed on a low-temperature fired ceramic green sheet layered product for forming a surface conductor by constrained firing, the conductive paste comprising 60 to 95 mass % of an Ag powder as the content in a paste composition, 0.5 to 5 mass % of a borosilicate based glass powder relative to the Ag powder, the remainder being a platinum group metal additive and an organic vehicle, wherein the platinum group metal additive contains at least two metals of Ru and Rh, and the content of Ru and the content of Rh in the platinum group metal additive are 0.05 to 5 mass % of Ru and 0.001 to 0.1 mass % of Rh, respectively in terms of metal components relative to the mass of the Ag powder.

Another embodiment of the present invention is a ceramic substrate manufactured by constrained firing a low-temperature fired ceramic green sheet layered product on which the above conductive paste is printed as a surface conductor.

Advantageous Effect of Invention

The present invention can provide an Ag based conductive paste for constrained firing and a ceramic substrate manufactured with the conductive paste, the conductive paste having an excellent plating resistance and a good adherence against a ceramic substrate and a plated film even after plating treatment, wherein a constraining layer after firing can be easily removed without remaining on a surface conductor in a case where co-firing is performed. This effect can be achieved when the contents of an Ag powder, a glass powder and an organic vehicle as components of a conductive paste as well as the type and content of a platinum group metal additive are optimized as defined in the present invention so that these components may act in a synergistic fashion to form a densified array.

DESCRIPTION OF EMBODIMENTS

Below, the present invention will be described in detail. As described above, the conductive paste according to the present invention is suitable for being printed on a low-temperature fired ceramic green sheet layered product to be co-fired by the constrained firing method to form a surface conductor, the low-temperature fired ceramic green sheet layered product containing an Ag powder, a glass powder, a platinum group metal additive and an organic vehicle.

In the conductive paste according to the present invention, a relatively inexpensive Ag powder having superior electric conductivity is used as a conductor powder for low-temperature firing. The above Ag powder may consist of an Ag powder only, or may mainly comprise an Ag powder to which other noble metal powders (for example, powders of Pd, Pt and Au) if desired. In that case, an alloy powder of Ag and other noble metals may be used.

In a case where powders of Ag—Pd, Ag—Pt and Ag—Pd—Pt in which particularly a Pd powder and/or a Pt powder is (are) added (or alloyed) are used as the above Ag powder, soldering resistance and the like are improved as compared with an Ag powder alone, and sintering control effects can also be expected when a Pd powder and/or a Pt powder is (are) added. The addition amount of other noble metals to Ag may be appropriately selected depending on required properties such as soldering resistance.

The above Ag powder preferably comprises 20 mass % or more, preferably 20 to 80 mass %, more preferably 30 to 80 mass % of an Ag powder having a mean secondary particle diameter of 20 to 60 μm, the remainder being an Ag powder having a mean secondary particle diameter of 3 to 10 μm before kneaded with other components of a paste composition. As the above Ag powder, an Ag powder having a larger mean secondary particle diameter can control excessively promoted sintering of Ag, and prevent a large amount of a glass component from depositing on the surface of a surface conductor. Further, by using those in which the above two Ag powders having different mean secondary particle diameters, when kneading with a glass powder and a platinum group metal additive, aggregates are pulverized and dispersed together with the glass powder and the platinum group metal additive. This allows each composition component in a paste composition to form an appropriate dispersion state. Therefore, unlike a paste composition prepared from a powder having a small secondary particle diameter alone, the Ag powder, the glass powder and the platinum group metal additive synergistically act and sintered in a sintering process to prevent uneven distribution of each composition component. As a result, an appropriately densified sintered structure can be formed. This allows a constraining layer after firing to be removed much easily for the appropriate formation of a plated film without compromising plating resistance and electric conductivity of a surface conductor. Further, the contraction percentage of a conductive paste during firing can also be easily adjusted. Note that the mean secondary particle diameter refers to a mean particle diameter (median diameter: D50) of aggregated primary particles (secondary particles) in which two or more primary particles aggregate to form a mass.

The mean secondary particle diameter of the above Ag powder may be determined by the laser diffraction method. According to the laser diffraction method, a predetermined amount of an Ag powder sample is introduced into 0.1% aqueous sodium hexametaphosphate to perform ultrasonic dispersion, and then a light scattering intensity distribution pattern of a laser beam is measured to obtain the mean particle diameter (median diameter: D50) of aggregated particles from the measurement results.

Among the aforementioned two Ag powders having different mean secondary particle diameters, an Ag powder having a mean secondary particle diameter of 20 to 60 μm is preferably formed with primary particles having a mean particle diameter of 2 to 15 μm, and an Ag powder having a mean secondary particle diameter of 3 to 10 μm is preferably formed with primary particles having a mean particle diameter of 1 to 5 μm in view of enhanced action of a glass powder and a platinum group metal additive. Further, in a case where the aforementioned two Ag powders having different mean secondary particle diameters are used, the specific surface area of an Ag powder having a mean secondary particle diameter of 20 to 60 μm as measured by the BET method is preferably 0.1 to 0.3 m$^2$/g, and the TAP density is preferably 1 to 3 g/cm$^3$. The specific surface area of an Ag powder having a mean secondary particle diameter of 3 to 10 μm as measured by the BET method is preferably 0.2 to 0.4 m$^2$/g, and the TAP density is preferably 2 to 5 g/cm$^3$.

There is no particular limitation for the shape of the above Ag powder, but it is preferably spherical in view of higher densification of a surface conductor. In this context, the term "spherical" refers to a shape in which the aspect ratio (a value obtained by dividing the mean longer diameter by the mean shorter diameter) is approximately in a range between 1 and 1.1. An Ag powder having a granular shape as described above shows less mutual entanglement, leading to improved dispersibility in a conductive paste.

The content of the above Ag powder is preferably set to be 60 to 95 mass %, and in particular 80 to 90 mass % relative to the total mass of the conductive paste according to the present invention. In a case where the content of an Ag powder is less than 60 mass %, a value of electric resistance of a surface conductor may increase, and electrical properties may not be stabilized. In contrast, in the case of more than 95 mass %, a paste-like state can not be obtained due to too small amount of organic components, and a film may not be formed by printing.

Next, as a glass powder to be blended with the conductive paste according to the present invention, a borosilicate based glass is used. In particular, those containing three components of silica, boric acid and an alkali metal oxide (the general formula: $R_2O$ wherein R represents an alkali metal such as Li, Na and K) as constituting components are preferably used although not limited to these. In a case where these three components are contained, synergistic effects from the action with the above glass powder and the platinum group metal additive are obtained, and the electric conductivity and adherence of a surface conductor are both improved. Therefore, they are preferably used. As the above alkali metal oxide, $K_2O$ and $Na_2O$ are particularly preferred. Further, preferably used as the above glass powder is the same glass component as a glass component contained in a low-temperature fired ceramic green sheet to be co-fired with a conductive pattern.

The softening point of the above glass powder is preferably in a range of 710 to 890° C. Since sintering of Ag is promoted from a relatively low temperature in a case where the softening point is lower than 710° C., the contraction behavior becomes different from that of a ceramic sheet, and a substrate after firing may be deformed and a crack may be developed in the substrate. On the other hand, in a case where the softening point is higher than 890° C., glass remains on the surface of a fired film of a surface conductor, resulting in deteriorated solder wettability of the surface conductor, and the viscosity of the glass does not sufficiently decrease in a firing process, and it may not function as an adhesive component.

The content of the above glass powder is selected so that it is 0.5 to 5 mass % relative to the mass of the above Ag powder. In a case where the content of a glass powder is less than 0.5 mass %, the amount of glass between a ceramic substrate and a surface conductor is decreased, resulting in a decreased adherence between the ceramic substrate and the surface conductor. On the other hand, in a case where the content of a glass powder is more than 5 mass %, a large amount of a glass component are deposited on the surface of a surface conductor. As a result, a large amount of residual materials of a constraining layer are generated, and plating is interfered by the residual materials. This may easily cause poor plating. Further, the mean particle diameter (D50) of a glass powder is preferably 0.8 to 2.5 μm. The mean particle diameter may be computed by the common electron microscopy method, the laser diffraction method and the like.

A platinum group metal additive containing at least two metals of Ru (ruthenium) and Rh (rhodium) is blended with the conductive paste according to the present invention. The platinum group metal additive and use of other composition components in appropriate amounts synergistically act to produce the effects of the present invention.

Either Ru alone or a Ru compound may be used as an addition form of Ru. In the case of Ru alone, a Ru powder is preferably used having a specific surface area of 80 to 180 $m^2/g$, in particular 100 to 150 $m^2/g$ as measured by the BET method and the like. Further, as a Ru compound, a so-called Ru resinate such as a cyclic-terpene containing sulfur Ru compound, or a ruthenium oxide may be used although not limited to these.

Either Rh alone or a Rh compound may be used as an addition form of Rh. In the case of Rh alone, a Rh powder is preferably used having a specific surface area of 80 to 180 $m^2/g$, in particular 100 to 150 $m^2/g$ as measured by the BET method and the like. Further, as a Rh compound, a so-called Rh resinate such as a cyclic-terpene containing sulfur Rh compound may be used although not limited to these.

In the above platinum group metal additive, when the content of each of Ru and Rh is 0.05 to 5 mass % and 0.001 to 0.1 mass % respectively relative to the mass of the above Ag powder in terms of a metal content in the above platinum group metal additive, the effects from the above platinum group metal additive can be obtained. Preferably, 0.1 to 1 wt % of Ru and 0.005 to 0.05 wt % of Rh are used. In a case where the content of Ru is less than 0.05 mass %, a large amount of a glass component are deposited on the surface of a surface conductor. As a result, a large amount of residual materials of a constraining layer are generated, and plating is interfered by the residual materials. This may easily cause poor plating. In a case where the content of Ru is more than 5 wt %, a fired film becomes porous, and a plating solution may enter the inside of the film, resulting in a decreased adherence between a ceramic substrate and a surface conductor. Similarly, in a case where the content of Rh is less than 0.001 mass %, poor plating is caused; and in a case where it is more than 0.1 mass %, the adherence between a ceramic substrate and a surface conductor is reduced.

Next, as an organic vehicle to be blended in the conducive paste according to the present invention, mixtures of an organic resin, an organic solvent and an additive which are conventionally used may be used. Examples of the organic resin include resins such as ethyl cellulose based resins, acrylic resins and epoxy based resins.

An organic solvent in an organic vehicle may be appropriately selected in view of the dispersibility of an Ag powder and the like, and various organic solvents of hydrocarbon-based, alcohol-based and the like may be used. They include, for example, terpineol [TPO], butylcarbitol acetate [BCA], ester alcohol and turpentine oil. The organic solvents may be used alone, or may be used in combination of two or more.

The organic vehicle used for producing the conductive paste according to the present invention may be obtained by mixing with a common additive (a surfactant, a dispersing agent, a thickening agent and the like), if desired.

Meanwhile, the ceramic substrate according to the present invention may be manufactured by printing the conductive paste according to the present invention on a low-temperature fired ceramic green sheet layered product by the screen printing method and the like; and then performing firing. For example, it is manufactured through the following steps. First, a screen mask in which a printing pattern is formed for printing via holes and a wiring pattern is mounted on a green sheet. A conductive paste is then supplied on the screen mask, and a hole-filling printing of via holes and printing of a wiring pattern are simultaneously performed by sliding a squeegee along the top surface of the screen mask.

Meanwhile, a surface conductor is printed on the top surface of a green sheet on the outermost layer using the conductive paste according to the present invention. Note that the conductive paste according to the present invention may be printed on a green sheet on the outermost layer and dried, and then layered to the remaining layered products to form a layered product before firing. Alternatively, it may be printed after layering a green sheet of the outermost layer on a layered product other than the outermost layer, and then dried to form a layered product before firing.

According to a method of preparing a low-temperature fired ceramic green sheet used for the present invention, for example, a glass-ceramic material comprising 30 to 50 wt % of an alumina component and 70 to 50 wt % of a glass component including $SiO_2$, $B_2O_3$, $Al_2O_3$, alkali earth metal oxides is mixed with an organic binder, a plasticizer and a solvent to form a slurry, and a sheet is formed on an organic film by the doctor blade method using the slurry to obtain a low-temperature fired ceramic green sheet. If desired, this is shaped into a predetermined shape, and via holes and the like are formed.

After the end of the simultaneous printing step, a lamination/pressure bonding step is performed to layer a green sheet of each layer, and the resulting layered products are bonded together under pressure and heating, for example, under conditions of 60 to 150° C. and 0.1 to 30 MPa (preferably 1 to 10 MPa).

Subsequently, a constrained firing step is performed to layer an alumina constraining green sheet onto the both sides of a layered product of green sheets. While applying pressure to the layered product in this state, firing is performed under air atmosphere under conditions of a rate of temperature increase of 10° C./min, a peak firing temperature of 800 to 1000° C. (preferably around 900° C.) and a holding time of 20 minutes to perform co-firing of the layered product of green sheets with an inner layer/surface conductor and a via conductor. Subsequently, residual materials of the alumina constraining green sheets are removed from the both sides of the fired substrate by the blast treatment and the like to manufacture a low-temperature fired ceramic multilayered circuit substrate. A ceramic substrate having an excellent substrate dimensional accuracy in which substrate contraction due to firing is small can be manufactured by the constrained firing method.

EXAMPLES

Below, Examples and Comparative Examples of the present invention will be described. Note that these are merely illustrative, and shall not limit the scope of the present invention.

Examples 1 to 14, Comparative Examples 1 to 4

An Ag powder, a glass powder and a platinum group metal additive, the remainder being an organic vehicle (in which ethyl cellulose and ester alcohol are used as a resin component and a solvent component, respectively) were kneaded according to the contents shown in Table 1 to produce a conductive paste for forming a surface conductor on a low-temperature fired ceramic green sheet layered product. Note that a spherical powder was used as the Ag powder, and a mixture of two Ag powders having different mean secondary particle diameters was used except for Example 8. The mean secondary particle diameter of an Ag powder before kneading with other paste composition components was measured by the laser diffraction method using a Nikkiso laser diffraction/scattering grading analyzer MT-3000. The mean particle diameter of a glass powder was measured by the laser diffraction method as in the case of the secondary particle diameter of the Ag powder. The mean particle diameter (D50) was 0.8 to 2.5 µm. Further, the BET specific surface areas of fine powders of Ru and Rh oxides used as the platinum group metal additive were both 100 to 150 m$^2$/g.

Subsequently, on each green sheet for a substrate which will form each layer of a multilayered ceramic substrate, penetration holes which form through-holes were punched, and filled with the above conductive paste. Further, elements such as inductors and capacitors were formed if desired, and conductive pattern portions which connect each element were provided. A total of 13 green sheets for substrates were layered. Then, a surface conductor having a thickness of 25 µm was printed on one ceramic green sheet using the above conductive paste by the screen printing. The resulting substrate was layered with the layered product prepared above so that the back of the printed surface of the substrate was in contact with the surface of the layered product to obtain a ceramic green sheet layered product.

Subsequently, in order to perform constrained firing for assuring dimensional accuracy to the lateral both sides (the Z surface, the both sides of the outermost layer) perpendicular to the printed surface of the above ceramic green sheet layered product after printing, a green sheet for constraint comprising alumina as a main component was layered to form a constraining layer.

The green sheet layered product layered with the above constraining layer was placed in a common mold having flat upper and lower punches, and pressurized at 700 kg/cm$^2$ for 7 minutes, and then placed on a setter plate to perform debinding without installing a cover. Debinding was performed at 260° C. for 4 hours with a rate of temperature increase of 20° C./min. Subsequently, a setter plate was also layered on the above green sheet layered product, and firing was performed. At this time, the firing temperature was 920° C., and the firing time was 4 hours at this temperature.

After performing firing as described above, the restraining green sheet fired product of the resulting fired substrate (multilayer ceramics substrate) was removed by the blast treatment and water washing. Subsequently, a proportion of metal-exposed area (residual material removal percentage) relative to the formed area of the surface conductor was computed by observing residual materials of the constraining layer on the surface of the surface conductor on the substrate.

The residual material removability of the constraining layer was evaluated as "Good" when the residual material removal percentage was 95% or more, and as "Bad" when less than 95%. Note that solder wettability and plating properties are good when the residual material removal percentage is 95% or more.

Figure 1:
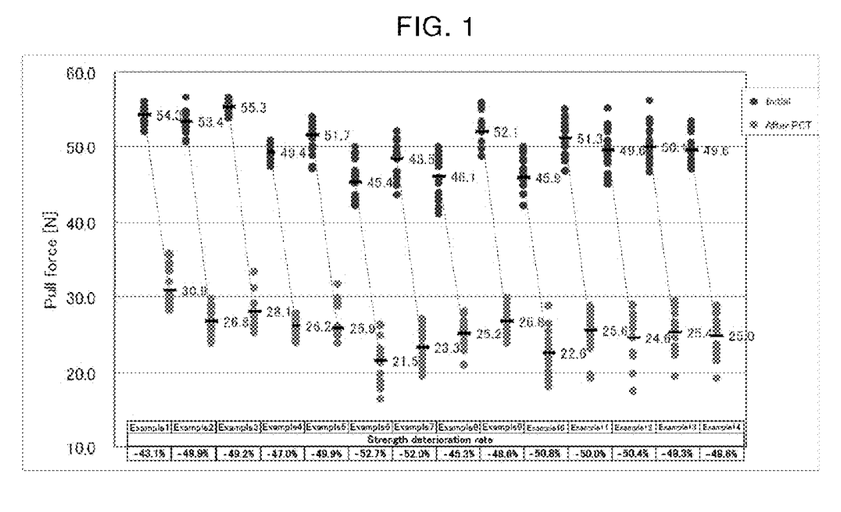
FIG. 1 shows results from measurements of substrate bonding strength deterioration rates (bottom terminal/mounted substrate).

Subsequently, electroless plating (acidic liquid) of Ni, Pd and Au was performed in this order on the above multilayer ceramics substrate, and dried at 80° C. for 6 minutes to form a plated film of the surface conductor. Plating properties after forming a plated film were evaluated by electron microscopy observation. Results are shown in Table 2. Those having good plating properties in which uneven plating was not observed were evaluated as "Good," and those having poor plating properties in which a constraining layer was clearly present on the whole or some of the plated surface were evaluated as "Bad." Further, bottom terminals were bonded on the resulting plated film with a solder comprising Sn (96.5%) Ag (3.0%) Cu (0.5%), and the substrate bonding strength deterioration rate (bottom terminal/mounted substrate) was computed from measured values of the pull strength for the solder. Calculation results are shown in FIG. 1. In the pull strength measurement tests, a value from a substrate subjected to two repeated heat treatments at 260° C. under an atmosphere (1 atm) was considered as the initial value, and a value from the substrate subsequently subjected to a treatment at 121° C. for 60 hours under an atmosphere (2 atm) having a humidity of 98% was considered as the deterioration value.

Then, an aluminum wire was bonded on the above plated film, and the evaluation of wire bonding properties (bonding tests) was repeated 20 times for each in which a wire was pulled upward at a rate of 0.1 mm/second with a pull test instrument PTR-1000 (which is a product name, and available from RHESCA Corporation). Wire bonding properties were evaluated by observation of a destruction mode. The normal destruction mode in which detachment from a multilayer ceramics substrate was not observed, and a wire was cut at the middle was evaluated as "Good." A destruction mode in which detachment was observed at the interface between a plated film and a surface conductor was evaluated as "Bad-1."

Figure 2:
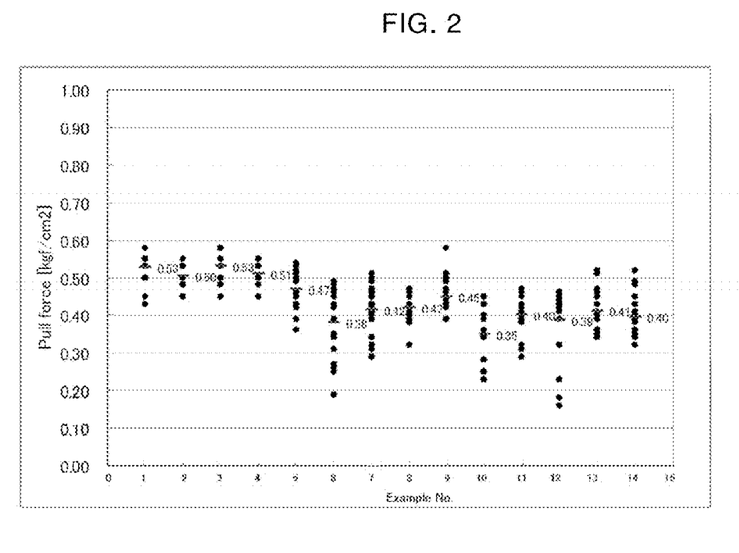
FIG. 2 shows results from measurements of pull strength when evaluating wire bonding properties (Example).
Figure 3:
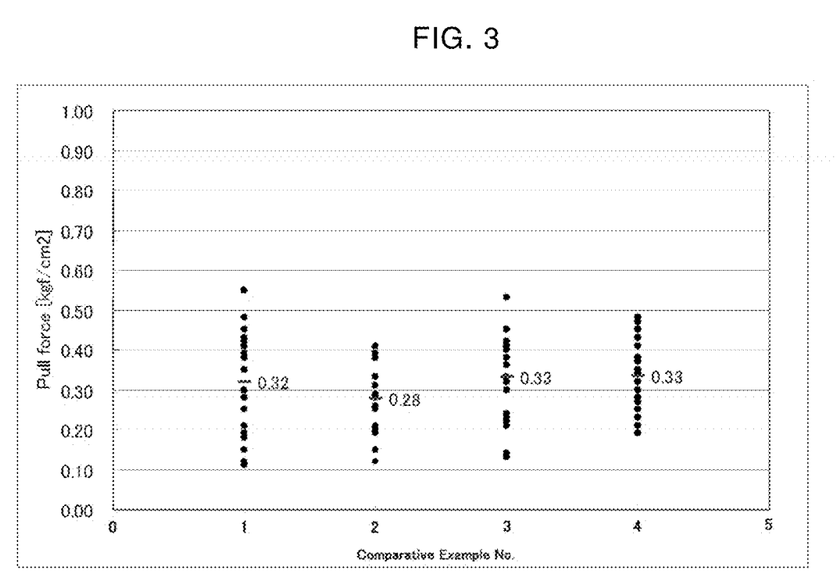
FIG. 3 shows results from measurements of pull strength when evaluating wire bonding properties (Comparative Example).

A destruction mode in which detachment was observed at the interface between a surface conductor and a ceramics substrate was evaluated as "Bad-2". Results are shown in Table 2. The pull strength measurement results from the above bonding tests are shown in FIGS. 2 and 3.

TABLE 1

| | Silver powder | | Glass powder | | | Platinum group metal additive | |
|---|---|---|---|---|---|---|---|
| | Mean secondary particle diameter before kneading (blending ratio) | Content (content percentage) | Composition | Softening point | Content (content percentage relative to mass of silver) | Type | Content (content percentage relative to mass of silver) |
| Example 1 | 6 µm/40 µm (50/50) | 990 g (83 mass %) | $SiO_2$—$B_2O_3$—$R_2O$ | 770-790 | 20 g (2 mass %) | Fine powder of Ru oxide Rh fine powder | 2 g (0.2 mass %) 0.1 g (0.01 mass %) |
| Example 2 | 6 µm/40 µm (50/50) | 990 g (83 mass %) | $SiO_2$—$B_2O_3$—$R_2O$ | 770-790 | 40 g (4 mass %) | Fine powder of Ru oxide Rh fine powder | 1 g (0.1 mass %) 0.5 g (0.05 mass %) |
| Example 3 | 6 µm/40 µm (50/50) | 990 g (83 mass %) | $SiO_2$—$B_2O_3$—$R_2O$ | 770-790 | 10 g (1 mass %) | Fine powder of Ru oxide Rh fine powder | 5 g (1.0 mass %) 0.05 g (0.005 mass %) |
| Example 4 | 3 µm/20 µm (50/50) | 990 g (80 mass %) | $SiO_2$—$B_2O_3$—$R_2O$ | 770-790 | 20 g (2 mass %) | Fine powder of Ru oxide Rh fine powder | 3 g (0.3 mass %) 0.2 g (0.02 mass %) |
| Example 5 | 10 µm/60 µm (50/50) | 990 g (90 mass %) | $SiO_2$—$B_2O_3$—$R_2O$ | 770-790 | 20 g (2 mass %) | Fine powder of Ru oxide Rh fine powder | 1 g (0.15 mass %) 0.1 g (0.01 mass %) |
| Example 6 | 6 µm/40 µm (50/50) | 990 g (60 mass %) | $SiO_2$—$B_2O_3$—$R_2O$ | 770-790 | 20 g (2 mass %) | Fine powder of Ru oxide Rh fine powder | 2 g (0.2 mass %) 0.1 g (0.01 mass %) |

TABLE 1-continued

| | Silver powder | | Glass powder | | | Platinum group metal additive | |
|---|---|---|---|---|---|---|---|
| | Mean secondary particle diameter before kneading (blending ratio) | Content (content percentage) | Composition | Softening point | Content (content percentage relative to mass of silver) | Type | Content (content percentage relative to mass of silver) |
| Example 7 | 6 μm/40 μm (50/50) | 990 g (95 mass %) | SiO$_2$—B$_2$O$_3$—R$_2$O | 770-790 | 20 g (2 mass %) | Fine powder of Ru oxide Rh fine powder | 2 g (0.2 mass %) 0.1 g (0.01 mass %) |
| Example 8 | 6 μm/40 μm (30/70) | 990 g (83 mass %) | SiO$_2$—B$_2$O$_3$—R$_2$O | 770-790 | 20 g (2 mass %) | Fine powder of Ru oxide Rh fine powder | 1 g (0.15 mass %) 0.1 g (0.01 mass %) |
| Example 9 | 6 μm/40 μm (70/30) | 990 g (83 mass %) | SiO$_2$—B$_2$O$_3$—R$_2$O | 770-790 | 20 g (2 mass %) | Fine powder of Ru oxide Rh fine powder | 3 g (0.3 mass %) 0.2 g (0.02 mass %) |
| Example 10 | 6 μm/— (100/0) | 990 g (83 mass %) | SiO$_2$—B$_2$O$_3$—R$_2$O | 770-790 | 20 g (2 mass %) | Fine powder of Ru oxide Rh fine powder | 1 g (0.15 mass %) 0.1 g (0.01 mass %) |
| Example 11 | 6 μm/40 μm (50/50) | 990 g (83 mass %) | SiO$_2$—B$_2$O$_3$—R$_2$O | 770-790 | 50 g (5 mass %) | Fine powder of Ru oxide Rh fine powder | 3 g (0.3 mass %) 0.2 g (0.02 mass %) |
| Example 12 | 6 μm/40 μm (50/50) | 990 g (83 mass %) | SiO$_2$—B$_2$O$_3$—R$_2$O | 770-790 | 5 g (0.5 mass %) | Fine powder of Ru oxide Rh fine powder | 3 g (0.3 mass %) 0.2 g (0.02 mass %) |
| Example 13 | 6 μm/40 μm (50/50) | 990 g (83 mass %) | SiO$_2$—B$_2$O$_3$—R$_2$O | 710-730 | 20 g (2 mass %) | Fine powder of Ru oxide Rh fine powder | 3 g (0.3 mass %) 0.2 g (0.02 mass %) |
| Example 14 | 6 μm/40 μm (50/50) | 990 g (83 mass %) | SiO$_2$—B$_2$O$_3$—R$_2$O | 870-890 | 20 g (2 mass %) | Fine powder of Ru oxide Rh fine powder | 3 g (0.3 mass %) 0.2 g (0.02 mass %) |
| Comparative Example 1 | 6 μm/40 μm (50/50) | 990 g (83 mass %) | SiO$_2$—B$_2$O$_3$—R$_2$O | 770-790 | 20 g (2 mass %) | Fine powder of Ru oxide | 2 g (0.2 mass %) |
| Comparative Example 2 | 6 μm/40 μm (50/50) | 83 mass % | SiO$_2$—B$_2$O$_3$—R$_2$O | 770-790 | 20 g (2 mass %) | Rh fine powder | 0.1 g (0.01 mass %) |
| Comparative Example 3 | 6 μm/40 μm (50/50) | 83 mass % | SiO$_2$—B$_2$O$_3$—R$_2$O | 770-790 | 3 g (0.3 mass %) | Fine powder of Ru oxide Rh fine powder | 2 g (0.2 mass %) 0.1 g (0.01 mass %) |
| Comparative Example 4 | 6 μm/40 μm (50/50) | 83 mass % | SiO$_2$—B$_2$O$_3$—R$_2$O | 770-790 | 60 g (6 mass %) | Fine powder of Ru oxide Rh fine powder | 2 g (0.2 mass %) 0.1 g (0.01 mass %) |

TABLE 2

| | Constraining layer removability | Plating property | Bonding test (destruction mode) | | | | | | | | | | | | | | | | | | |
|---|---|---|---|---|---|---|---|---|---|---|---|---|---|---|---|---|---|---|---|---|---|
| | | | 1 | 2 | 3 | 4 | 5 | 6 | 7 | 8 | 9 | 10 | 11 | 12 | 13 | 14 | 15 | 16 | 17 | 18 | 19 | 20 |
| Example 1 | G | G | G | G | G | G | G | G | G | G | G | G | G | G | G | G | G | G | G | G | G |
| Example 2 | G | G | G | G | G | G | G | G | G | G | G | G | G | G | G | G | G | G | G | G | G |
| Example 3 | G | G | G | G | G | G | G | G | G | G | G | G | G | G | G | G | G | G | G | G | G |
| Example 4 | G | G | G | G | G | G | G | G | G | G | G | G | G | G | G | G | G | G | G | G | G |
| Example 5 | G | G | G | G | G | G | G | G | G | G | G | G | G | G | G | G | G | G | G | G | G |
| Example 6 | G | G | G | G | B2 | G | B2 | G | G | B2 | G | G | G | B2 | B2 | G | G | G | G | G | G |
| Example 7 | G | G | G | G | G | B1 | G | G | G | G | B1 | G | G | G | B1 | G | G | G | G | G | G |
| Example 8 | G | G | G | G | G | G | G | G | G | G | G | G | G | G | G | G | G | G | G | G | G |
| Example 9 | G | G | G | G | G | G | G | G | G | G | G | G | G | G | G | G | G | G | G | G | G |
| Example 10 | G | G | B1 | G | B1 | G | G | G | G | G | G | G | B1 | G | G | G | G | G | B1 | G | G |
| Example 11 | G | G | G | B1 | G | G | G | G | G | B1 | G | G | G | G | G | B1 | G | G | G | G | G |
| Example 12 | G | G | B2 | G | G | B2 | G | G | B2 | G | G | G | B2 | G | B2 | G | G | G | G | G | G |
| Example 13 | G | G | G | G | B | G | G | G | B2 | G | G | G | G | G | B1 | G | G | G | G | G | G |
| Example 14 | G | G | G | G | G | G | B2 | G | G | G | G | G | G | G | G | G | B2 | G | G | G | G |
| Comparative Example 1 | B | B | B1 | B1 | B1 | G | B1 | G | B1 | B1 | B1 | G | B1 | B1 | B1 | B1 | G | B1 | B1 | G | B1 | B1 |
| Comparative Example 2 | B | B | B1 | G | B1 | B1 | G | B1 | B1 | G | G | B1 | B1 | G | B1 | G | B1 | B1 | G | B1 | B1 | B1 |
| Comparative Example 3 | G | G | B2 | B2 | G | B2 | G | G | B2 | B2 | B2 | G | G | B2 | B2 | B2 | B2 | G | G | B2 | G | B2 |
| Comparative Example 4 | B | B | B1 | G | B1 | G | B1 | G | B1 | B1 | B1 | G | B1 | G | B1 | B1 | G | B1 | G | B1 | B1 | G |

As apparent from the above results, in the case of Comparative Examples 1 and 2 where the platinum group metal additive contained neither Ru nor Rh, good evaluation results were not obtained for either the constraining layer removability or plating properties. Further, with regard to wire bonding properties, interface detachment between a plated film and a surface conductor was often observed.

In the case of Comparative Example 3 where the content of a glass powder was low, the constraining layer removability and plating properties were good. However, with regard to wire bonding properties, interface detachment between a surface conductor and a ceramics substrate was often observed.

In the case of Comparative Example 4 where the content of a glass powder was high, good evaluation results were not obtained for either the constraining layer removability or plating properties. Further, with regard to wire bonding properties, interface detachment between a plated film and a surface conductor was often observed.

In contrast, in the case of Examples 1 to 14 where conductive pastes which satisfied the constituents according to the present invention, good evaluation results were obtained for any of the constraining layer removability, plating properties and wire bonding properties. Further, the increase in the pull strength was observed as compared with Comparative Examples.

The invention claimed is:

1. A conductive paste to be printed on a low-temperature fired ceramic green sheet layered product for forming a surface conductor by constrained firing, the conductive paste comprising 60 to 95 mass % of an Ag powder as the content in a paste composition, 0.5 to 5 mass % of a borosilicate based glass powder relative to the Ag powder, the remainder being a platinum group metal additive and an organic vehicle, wherein the platinum group metal additive contains at least two metals of Ru and Rh, and the content of Ru and the content of Rh in the platinum group metal additive are 0.05 to 5 mass % of Ru and 0.001 to 0.1 mass % of Rh respectively in terms of metal components relative to the mass of the Ag powder.

2. The conductive paste according to claim 1, wherein the glass powder has a softening point of 710 to 890° C.

3. The conductive paste according to claim 1 or 2, wherein the Ag powder comprises two Ag powders having different mean secondary particle diameters before kneaded with other paste composition components.

4. The conductive paste according to claim 3, wherein 20 mass % or more is an Ag powder having a mean secondary particle diameter of 20 to 60 μm relative to the mass of the Ag powder, the remainder being an Ag powder having a mean secondary particle diameter of 3 to 10 μm.

5. A ceramic substrate obtained by constrained-firing a low-temperature fired ceramic green sheet layered product on which the conductive paste according to any one of claims 1 to 4 is printed as a surface conductor.

\* \* \* \* \*